(12) United States Patent
Sato (10) Patent No.: US 8,803,219 B2
(45) Date of Patent: Aug. 12, 2014

(54) NONVOLATILE SEMICONDUCTOR MEMORY DEVICE AND METHOD OF MANUFACTURING

(71) Applicant: Kabushiki Kaisha Toshiba, Tokyo (JP)

(72) Inventor: Motoyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/748,101

(22) Filed: Jan. 23, 2013

(65) Prior Publication Data
US 2013/0341698 A1    Dec. 26, 2013

(30) Foreign Application Priority Data
Jun. 20, 2012   (JP) .................................. 2012-139021

(51) Int. Cl.
*H01L 29/788* (2006.01)
(52) U.S. Cl.
USPC ...................................... 257/316; 365/185.03
(58) Field of Classification Search
USPC .................... 257/261, 316, 314, 315, E29.17, 257/E29.201, E29.613, E29.66, E29.679, 257/E21.694, 325, 326; 438/287
See application file for complete search history.

(56) References Cited

U.S. PATENT DOCUMENTS

| | | | |
|---|---|---|---|
| 2004/0094793 A1* | 5/2004 | Noguchi et al. | 257/315 |
| 2009/0262583 A1 | 10/2009 | Lue | |
| 2009/0316480 A1* | 12/2009 | Bhattacharyya | 365/185.03 |
| 2011/0121381 A1 | 5/2011 | Kanemura et al. | |

FOREIGN PATENT DOCUMENTS

| | | |
|---|---|---|
| JP | 2009-290199 A | 12/2009 |
| JP | 2011-114057 A | 6/2011 |
| JP | 2011-142227 A | 7/2011 |
| JP | 2011-142246 A | 7/2011 |

OTHER PUBLICATIONS

STIC Search Note, Nov. 27, 2013.*

* cited by examiner

*Primary Examiner* — Matthew Reames
*Assistant Examiner* — Vincent Wall
(74) *Attorney, Agent, or Firm* — Holtz, Holtz, Goodman & Chick PC (57) ABSTRACT

A nonvolatile semiconductor memory device includes a first insulating layer on a semiconductor layer, a charge storage layer on the first insulating layer, a second insulating layer on the charge storage layer, and a control gate electrode on the second insulating layer. The charge storage layer includes a floating gate layer on the first insulating layer, an interface insulating layer on the floating gate layer, and a charge trap layer on the interface insulating layer, and a lower end of a conduction band of the interface insulating layer is higher than a trap level of the charge trap layer and is lower than a lower end of a conduction band of the charge trap layer.

12 Claims, 10 Drawing Sheets

F I G. 14

NONVOLATILE SEMICONDUCTOR MEMORY DEVICE AND METHOD OF MANUFACTURING

CROSS-REFERENCE TO RELATED APPLICATIONS

This application is based upon and claims the benefit of priority from Japanese Patent Application No. 2012-139021, filed Jun. 20, 2012, the entire contents of which are incorporated herein by reference.

FIELD

Embodiments described herein relate generally to a nonvolatile semiconductor memory device and method of manufacturing.

BACKGROUND

In a method for manufacturing the nonvolatile semiconductor memory device, for example, a flash memory, there is a step of tentatively forming a memory cell area into a fin shape. With the progress of microfabrication of the memory cell, an aspect ratio of the fin-shaped memory cell area is increased in the step, and unfortunately sometimes the fin-shaped memory cell area collapses.

In order to solve the problem, a hybrid structure was developed in which a charge storage layer of the memory cell is formed by stacking a floating gate layer and a charge trap layer. The hybrid structure attracts attention as a technology of reducing the aspect ratio of the fin-shaped memory cell area during the manufacturing process, because a height of the charge storage layer can be suppressed.

However, in the memory cell having the hybrid structure, it is difficult to simultaneously satisfy improvements of a write characteristic and a data retaining characteristic.

DETAILED DESCRIPTION

In general, according to one embodiment, a nonvolatile semiconductor memory device includes: a semiconductor layer; a first insulating layer on the semiconductor layer; a charge storage layer on the first insulating layer; a second insulating layer on the charge storage layer; and a control gate electrode on the second insulating layer, wherein the charge storage layer includes a floating gate layer on the first insulating layer, an interface insulating layer on the floating gate layer, and a charge trap layer on the interface insulating layer, and a lower end of a conduction band of the interface insulating layer is higher than a trap level of the charge trap layer and is lower than a lower end of a conduction band of the charge trap layer.

Hereinafter, an embodiment will be described with reference to the drawings.

The hybrid structure on which a memory cell of an embodiment is predicated will be described first.

One of the features of the memory cell having the hybrid structure is that a charge storage layer is formed by stacking a floating gate layer including a conductive layer that is in an electrically floating state and a charge trap layer including an insulating layer having a function of locally trapping a charge.

In the hybrid structure, the floating gate layer is disposed on a tunnel barrier layer side, the charge trap layer is disposed on a block insulating layer side, and the floating gate layer acts as a buffer layer that accumulates as many charges as possible in the charge trap layer on the block insulating layer side.

Another feature of the hybrid structure is that an interface insulating layer is disposed between the floating gate layer and the charge trap layer in order not to leak the charge accumulated in the charge trap layer to the floating gate layer.

In the hybrid structure, compared with the structure in which the charge storage layer is formed by a single layer of the floating gate layer or the charge trap layer, the more charges can be accumulated in an area close to the block insulating layer in the whole areas of the charge storage layer. Therefore, even if the height of the charge storage layer is decreased, a variation in threshold voltage can be reduced to ensure a sufficient read margin.

In the hybrid structure, for example, even if the memory cell area is tentatively formed into the fin shape during the manufacturing process in a flat cell structure in which an upper surface of an element isolation insulating layer is on the substantially same level as the upper surface of the charge storage layer, the aspect ratio of the memory cell area is reduced, so that a collapse of the fin-shaped memory cell area can be prevented.

However, in the conventional hybrid structure, the improvements of the write characteristic and the data retaining characteristic (a retention characteristic) can insufficiently be implemented.

When the inventors studied the reason that the write characteristic and the data retaining characteristic are insufficiently improved, they found that it is attributed to the interface insulating layer located between the floating gate layer and the charge trap layer.

Generally the interface insulating layer is made of materials, such as a silicon nitride layer (for example, SiN), in which a lower end of a conduction band is higher than a lower end of a conduction band of the charge trap layer such that the charge accumulated in the charge trap layer does not easily come out to the floating gate layer.

However, in this case, it is necessary that the charge in the floating gate layer be move across an energy barrier of the interface insulating layer in order to accumulate the charge in the charge trap layer. As a result, the sufficient write characteristic is not obtained.

In the case that the silicon nitride layer is used as the interface insulating layer, because the silicon nitride layer has a charge trapping nature, the charge accumulated in the charge trap layer comes easily out to the floating gate layer. This means that an original purpose of providing the interface insulating layer cannot be implemented, and therefore the sufficient charge retaining characteristic is not obtained.

The characteristic of the interface insulating layer necessary to improve the write characteristic and the charge retaining characteristic and the material necessary to improve the characteristics in the hybrid structure will be described below.

[Structure]

Figure 1:
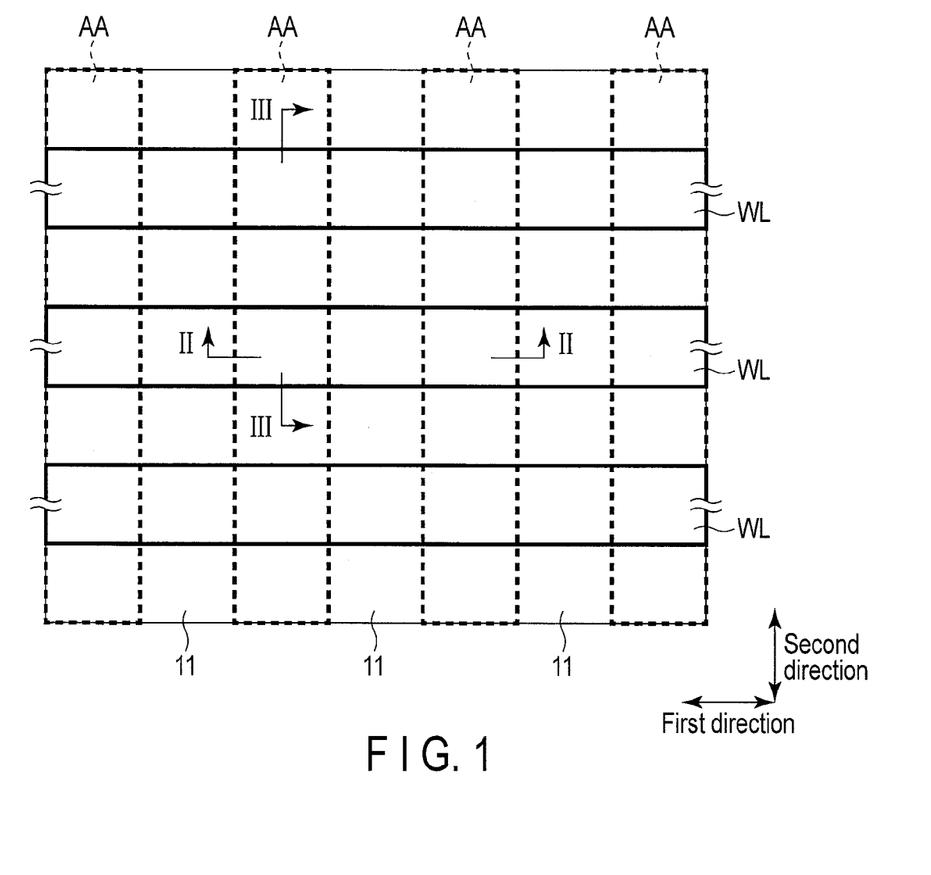
FIG. 1 is a plan view illustrating a memory cell of an embodiment.
Figure 2:
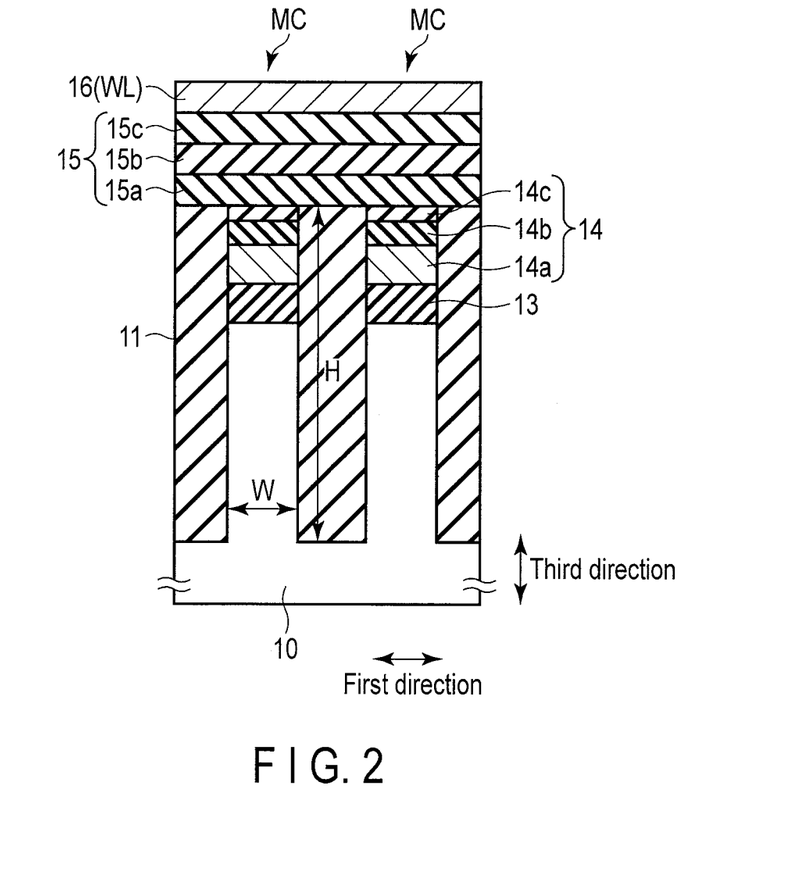
FIG. 2 is a sectional view along line II-II in FIG. 1.
Figure 3:
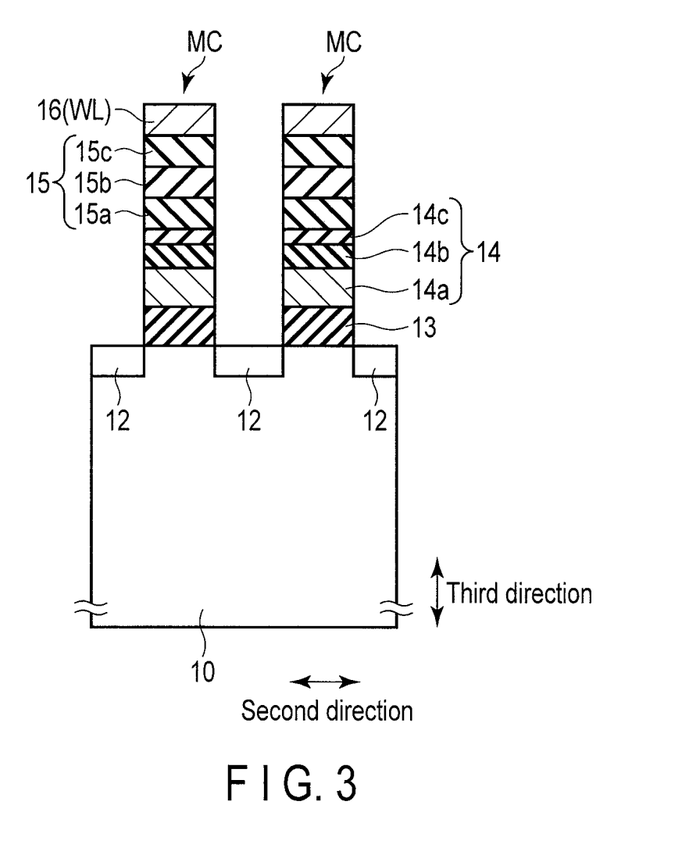
FIG. 3 is a sectional view along line III-III in FIG. 1.

FIG. 1 is a memory cell in a memory cell array constituting a nonvolatile semiconductor memory device. FIG. 2 is a sectional view along line II-II in FIG. 1. FIG. 3 is a sectional view along line III-III in FIG. 1.

Although the flat cell structure in which the upper surface of an element isolation insulating layer 11 is on the substantially same level as the upper surface of a charge storage layer 14 is described in the embodiment, the structure of a memory cell MC is not limited to the flat cell structure. The memory cell MC may have either a two-dimensional structure or a three-dimensional structure.

The memory cell MC may be a binary memory in which binary data (one-bit data) is stored according to a charge amount in the charge storage layer 14 or a multivalued memory in which at least four-value data (two-bit data) is stored.

For example, a semiconductor layer (for example, a semiconductor substrate) 10 is a silicon layer. For example, the element isolation insulating layer 11 is an STI (Shallow Trench Isolation). The element isolation insulating layer 11 is arranged in a first direction and extends to a second direction. For example, the element isolation insulating layer 11 is a silicon oxide layer, and a trench provided on a surface in a third direction of the semiconductor layer 10 is filled with element isolation insulating layer 11.

An active area AA is the semiconductor layer 10 sandwiched between the element isolation insulating layers 11. Like the element isolation insulating layer 11, the active area AA is arranged in the first direction and extends to a second direction.

For example, a plurality of memory cells MC connected in series is disposed on the semiconductor layer 10 in the active area AA. In the embodiment, the memory cell array has a NAND structure. However, the memory cell array is not limited to the NAND structure.

Each of the memory cells MC includes a plurality of source/drain regions 12 that is disposed in a surface region of the semiconductor layer 10, a gate insulating layer (tunnel insulating layer) 13 that is disposed on a channel region between the source/drain regions 12, a charge storage layer 14 that is disposed on the gate insulating layer 13, a block insulating layer 15 that is disposed on the charge storage layer 14, and a control gate electrode 16 that is disposed on the block insulating layer 15.

The control gate electrode 16 extends in the first direction and acts as a word line WL.

In the embodiment, the memory cell MC includes the source/drain region 12. However, the source/drain region 12 may be eliminated. This is because, when a distance between the memory cells MC connected in series is narrowed, a conduction route penetrating through the channel regions of the memory cells MC can be generated by what is called a fringe effect even if the source/drain region 12 is eliminated.

The charge storage layer 14 includes a floating gate layer 14a that is disposed on the gate insulating layer 13, an interface insulating layer 14b that is disposed on the floating gate layer 14a, and a charge trap layer 14c that is disposed on the interface insulating layer 14b. In the hybrid structure, the floating gate layer 14a plays an auxiliary role in easily trapping and retaining a carrier in the charge trap layer 14c.

At this point, in the embodiment, the interface insulating layer 14b is made of a material satisfying the following conditions in order to improve the write characteristic and the data retaining characteristic.

The lower end of the conduction band is higher than a trap level of the charge trap layer.

The lower end of the conduction band is lower than the lower end of the conduction band of the charge trap layer.

The material has no charge trap characteristic.

This is described in detail in the energy band.

In the embodiment, each of the memory cell MC has the flat cell structure. That is, the upper surface of the element isolation insulating layer 11 is the substantially same level as the upper surface of the charge storage layer 14, and an underlayer of the block insulating layer 15 is flat.

In the flat cell structure, the memory cell area is tentatively formed into the fin shape before the element isolation insulating layer 11 is formed, and it is well known that the aspect ratio (H/W) of the memory cell area is increased with the progress of the microfabrication.

However, in the embodiment, the height (a width in the third direction) of the charge storage layer 14 can be decreased because of the improvements of the write characteristic and the data retaining characteristic. Therefore, the increase of the aspect ratio of the memory cell area can be suppressed to prevent the collapse of the fin-shaped memory cell area during the manufacturing process.

This is described in detail in the manufacturing process.

The block insulating layer 15 has a stacked structure, and includes first to third layers. A first layer 15a is an insulating layer that has a high potential barrier in order to prevent a leakage in writing the data. For example, the first layer 15a is a silicon oxide layer ($SiO_2$). A second layer 15b is an insulating layer that has a high dielectric constant in order to improve a coupling ratio of the memory cell MC. For example, the second layer 15b is a hafnium oxide layer ($HfO_2$). A third layer 15c is a buffer layer that prevents a reaction between the second layer 15b and the control gate electrode 16. For example, the third layer 15c is a tantalum oxide layer (TaO).

In the embodiment, the block insulating layer 15 has the three-layer structure. However, the block insulating layer 15 is not limited to the three-layer structure. For example, the block insulating layer 15 may have a single-layer structure. An interface layer may exist between the charge storage layer 14 and the block insulating layer 15 or/and between the block insulating layer 15 and the control gate electrode 16.

Figure 4:
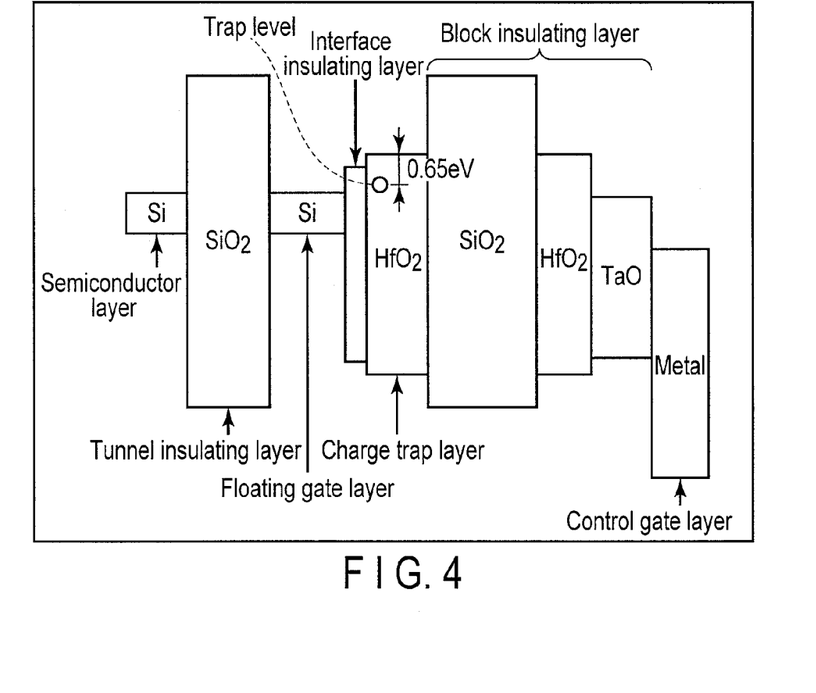
FIG. 4 is an energy band diagram of the memory cell of the embodiment.
Figure 5:
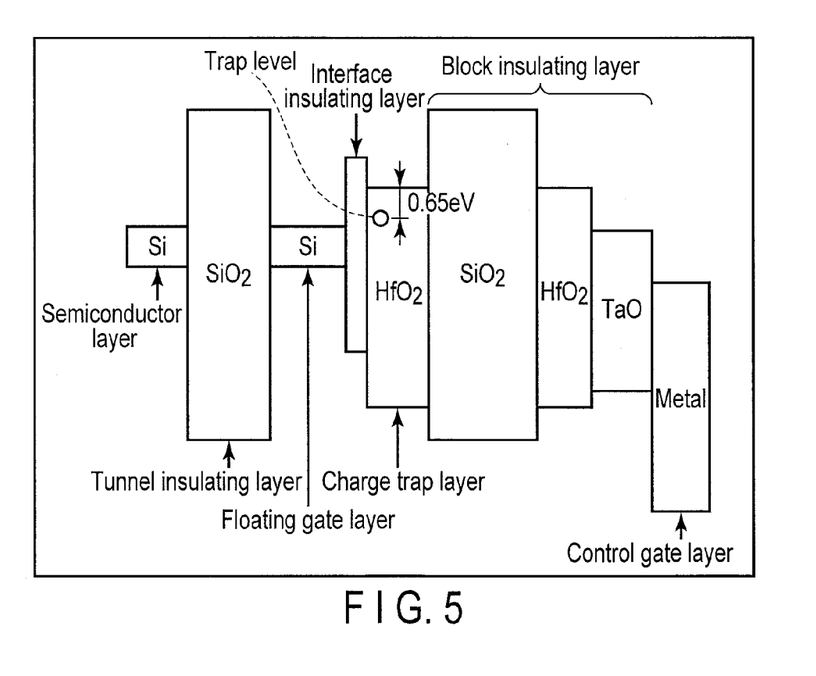
FIG. 5 is an energy band diagram of a memory cell of a comparative example.

FIG. 4 illustrates an energy band diagram of the memory cell of the embodiment. FIG. 5 illustrates an energy band diagram of a memory cell of a comparative example.

In FIGS. 4 and 5, a vertical direction indicates energy and a horizontal direction indicates a position of each layer.

The example and the comparative example are identical to each other except a band structure of the interface insulating layer. That is, the characteristics of the embodiment and the characteristics of the comparative example are compared to each other on the assumption that the embodiment and the comparative example are identical to each other in the semiconductor layer, the tunnel insulating layer, the floating gate layer, the charge trap layer, the block insulating layer, and the control gate electrode and that the embodiment and the comparative example are different from each other only in the interface insulating layer.

In the comparative example, the lower end of the conduction band of the interface insulating layer is higher than the lower end of the conduction band of the charge trap layer in order to improve the data retaining characteristic. For example, when the charge trap layer is made of $HfO_2$, SiN is used as the interface insulating layer.

On the other hand, in the embodiment, the lower end of the conduction band of the interface insulating layer is lower than the lower end of the conduction band of the charge trap layer in order to improve the data retaining characteristic. Therefore, in writing the data, the potential barrier against the carrier moving from the floating gate layer (for example, Si) to the charge trap layer is reduced to improve the write characteristic.

In the embodiment, the lower end of the conduction band of the interface insulating layer is higher than the trap level of the charge trap layer in order to improve the data retaining characteristic. That is, in order to prevent the carrier trapped by the charge trap layer from coming out to the floating gate layer, the lower end of the conduction band of the interface insulating layer may be higher than the trap level of the charge trap layer, but it is not necessary that the lower end of the conduction band of the interface insulating layer be higher than the lower end of the conduction band of the charge trap layer.

Therefore, in the embodiment, both the write characteristic and the data retaining characteristic can be improved.

When the charge trap layer is made of $HfO_2$, HfMgO can be cited as an example of the material for the interface insulating layer satisfying the condition. That is, the trap level of $HfO_2$ is located lower than the lower end of the conduction band of $HfO_2$ by about 0.65 eV. HfMgO has no charge trap characteristic, but the lower end of the conduction band of HfMgO exists between the lower end of the conduction band of $HfO_2$ and the trap level of $HfO_2$.

In the embodiment a relationship between the interface insulating layer and the charge trap layer is studied.

From the viewpoint of the manufacturing method, desirably the interface insulating layer and the charge trap layer include the same material. Therefore, the interface insulating layer and the charge trap layer can continuously be formed in the same chamber.

As a result of the study on the charge trap layer from the viewpoint of the manufacturing method, when an alkali metal or a lanthanoid-based material is added to the material of the charge trap layer, the function of trapping the charge is eliminated and the position of the lower end of the conduction band is lowered.

When such materials are used as the interface insulating layer, the write characteristic and the data retaining characteristic are improved, and a manufacturing cost can be reduced by simplifying the manufacturing method.

However, as described above, it is necessary that the lower end of the conduction band of the interface insulating layer be higher than the trap level of the charge trap layer.

In the case that the interface insulating layer includes the material to which the alkali metal or the lanthanoid-based material is added, the following materials can currently be cited as a material combination in which the lower end of the conduction band of the interface insulating layer is higher than the trap level of the charge trap layer.

Charge trap layer
$HfO_2$, HfSiO, $ZrO_2$, ZrSiO, and the like
Interface insulating layer
[A material in which Mg (the alkali metal) is added to the material for the charge trap layer]
HfMgO, HfMgSiO, ZrMgO, ZrMgSiO, and the like
[A material in which La or Y (the lanthanoid-based material) is added to the material for the charge trap layer]
HfLaO, HfLaSiC, ZrLaO, ZrLaSiO, HfYO, HfYSiO, ZrYO, ZrYSiO, and the like However, composition ratios of the materials for the charge trap layer and the interface insulating layer are not limited to the above examples. For example, the composition ratio can properly be changed on the condition that the charge trap layer and the interface insulating layer are maintained in a stable state.

Figure 6:
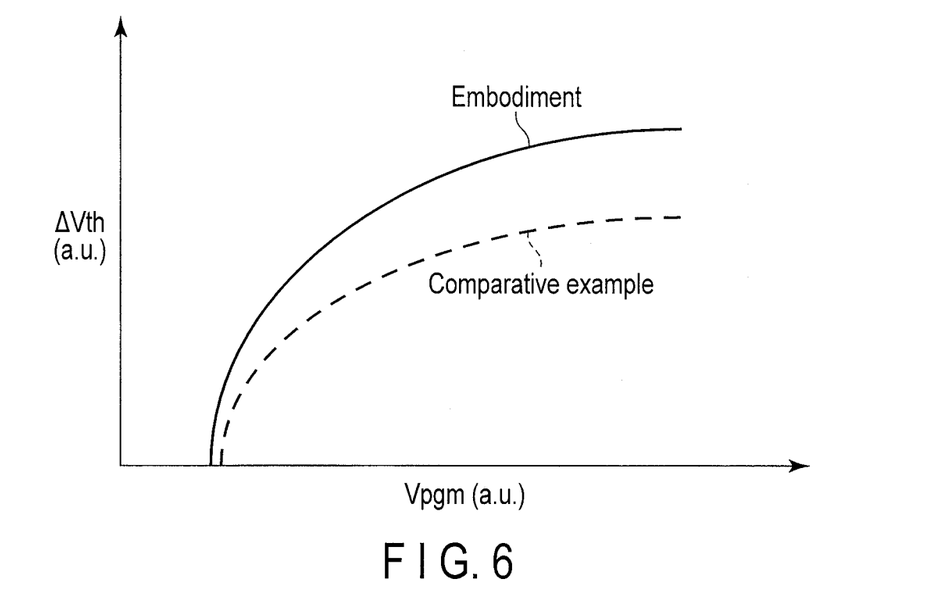
FIG. 6 is a characteristic diagram illustrating a write characteristic.

FIG. 6 is a view in which the write characteristic of the embodiment is compared to that of the comparative example.

The write characteristic of the memory cell is expressed by a relationship between a write voltage Vpgm and a shift $\Delta Vth$ of a threshold voltage.

As can be seen from FIG. 6, at the same write voltage, the shift $\Delta Vth$ of the threshold voltage of the embodiment is larger than the shift $\Delta Vth$ of the threshold voltage of the comparative example.

This means that, when the data is written on the same condition, the memory cell of the embodiment can trap the more charges in the charge trap layer compared with the memory cell of the comparative example.

According to the embodiment, the write characteristic can be improved.

Figure 7:
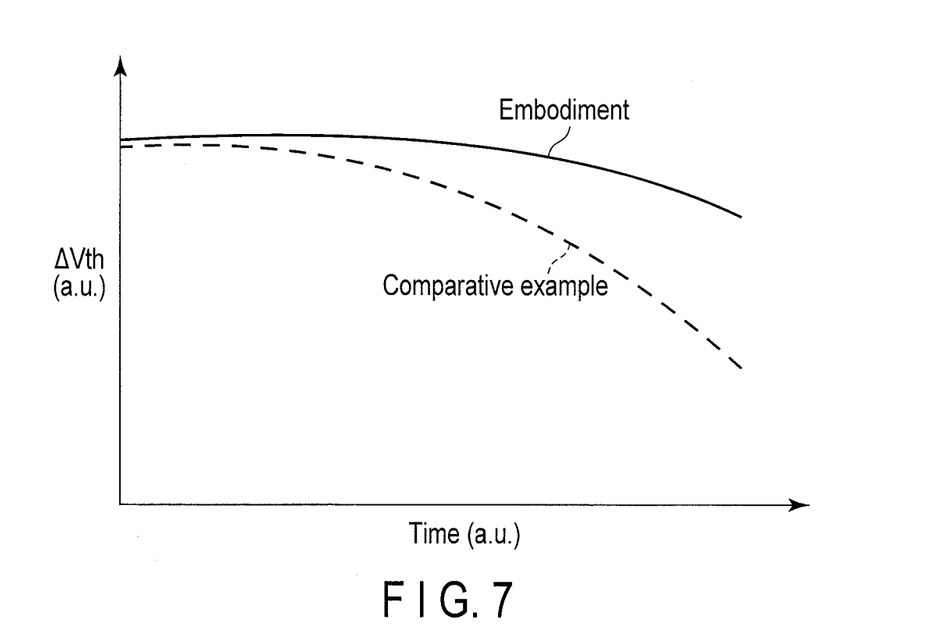
FIG. 7 is a characteristic diagram illustrating a data retaining characteristic.

FIG. 7 is a view in which the data retaining characteristic of the embodiment is compared to that of the comparative example.

The data retaining characteristic of the memory cell is expressed by a relationship between an elapsed time (Time) soon after the data is written and the shift $\Delta Vth$ of the threshold voltage.

As can be seen from FIG. 7, at the same threshold voltage of the memory cell soon after the data is written, the shift $\Delta Vth$ of the threshold voltage of the embodiment is smaller than the shift $\Delta Vth$ of the threshold voltage of the comparative example.

This means that, when the memory cells of the embodiment and the comparative example are placed in the same environment soon after the data is written, the memory cell of the embodiment can retains the more charges in the charge trap layer compared with the memory cell of the comparative example.

Thus, in the embodiment, the data retaining characteristic can be improved.

[Manufacturing Method]

The method for manufacturing the nonvolatile semiconductor memory device in FIGS. 1 to 3 will be described.

FIGS. 8 to 14 illustrate the method for manufacturing the nonvolatile semiconductor memory device in FIGS. 1 to 3.

In FIGS. 8 to 14, first, second, and third directions corresponds to the first, second, and third directions in FIGS. 1 to 3. For example, the first and second directions are parallel to the surface of the semiconductor layer 10 that is of the semiconductor substrate, and the first and second directions are orthogonal to each other. For example, the third direction is perpendicular to the surface of the semiconductor layer 10 that is of the semiconductor substrate.

For example, the first direction is a direction in which the control gate electrode (the word line) extends, and a direction parallel to a channel width of a cell transistor (FET: Field Effect Transistor) that is of the memory cell. For example, the second direction is a direction in which a bit line extends, and a direction parallel to a channel length of the cell transistor that is of the memory cell.

In FIGS. 8 to 14, the same element as that in FIGS. 1 to 3 is designated by the same numeral to clarify a corresponding relationship between the structure in FIGS. 1 to 3 and the manufacturing method in FIGS. 8 to 14.

Figure 8:
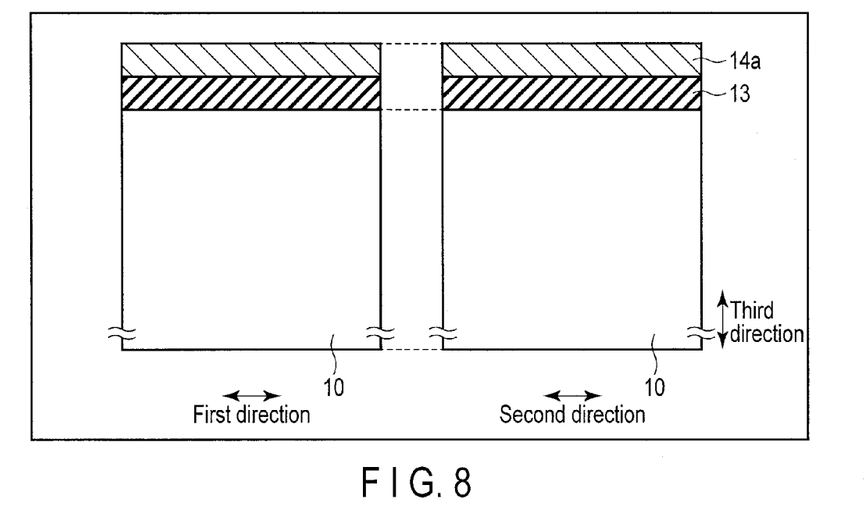
FIG. 8 is a sectional view illustrating a method for manufacturing the memory cell of the embodiment.

As illustrated in FIG. 8, for example, the gate insulating layer (for example, a silicon oxide layer) 13 is formed on the semiconductor layer 10 by a thermal oxidation method. Then, for example, the floating gate layer (for example, a conductive polysilicon layer) 14a is formed on the gate insulating layer 13 by a CVD method or an ALD method.

Figure 9:
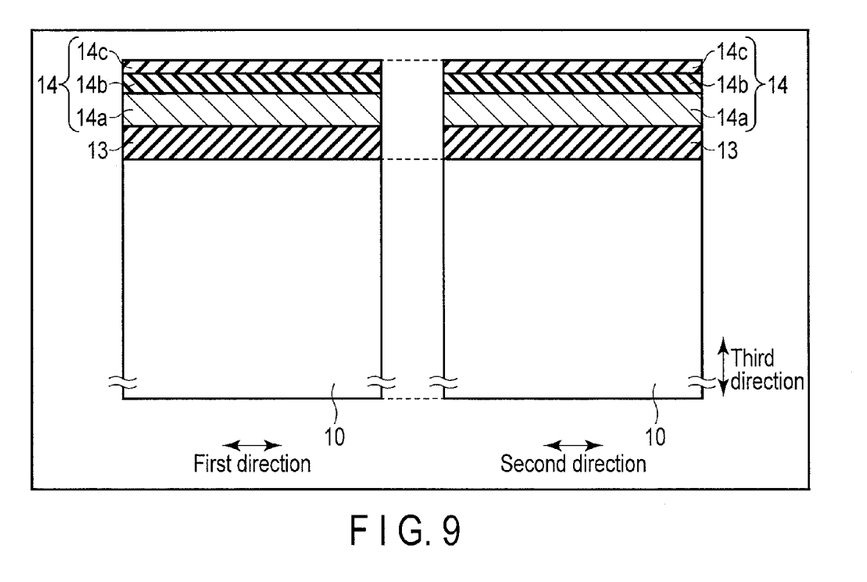
FIG. 9 is a sectional view illustrating the method for manufacturing the memory cell of the embodiment.

As illustrated in FIG. 9, the interface insulating layer 14b and the charge trap layer 14c are formed on the floating gate layer 14a.

At this point, as described above, for example, the interface insulating layer 14b is made of the material in which one of the alkali metal and the lanthanoid-based material is added to the material for the charge trap layer 14c, which allows the interface insulating layer 14b and the charge trap layer 14c to be continuously formed in the same chamber.

Figure 10:
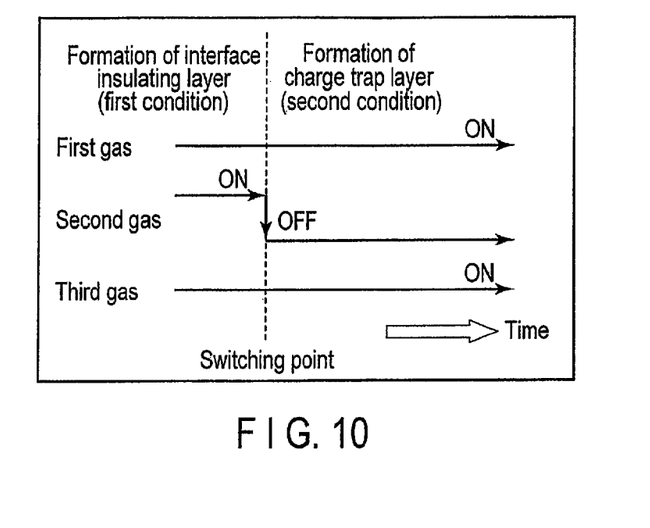
FIG. 10 is a view illustrating a method for continuously forming an interface insulating layer and a charge trap layer.

For example, as illustrated in FIG. 10, the interface insulating layer 14b is formed in an atmosphere, which includes a first gas (a gas including at least one of Hf, Zr, and Si), a second gas including one of the alkali metal and the lanthanoid-based material), and a third gas (a gas including oxygen, for example, $H_2O$ or $O_3$), as a first condition.

The charge trap layer 14c is formed in an atmosphere, which includes the first and third gases but does not include the second gas, as a second condition.

In this case, the interface insulating layer 14b and the charge trap layer 14c can continuously be formed in the same chamber by switching between the first and second conditions.

At this point, the switching between the first and second conditions may be performed only by stopping the supply of the second gas after the formation of the interface insulating layer 14b.

For example, after the interface insulating layer 14b is formed in the atmosphere including the first, second, and third gases by the CVD, the ALD method, or the PVD method, the charge trap layer 14c can be formed continuously only by stopping the supply of the second gas.

Desirably the interface insulating layer 14b and the charge trap layer 14c are formed by a method in which thicknesses of the interface insulating layer 14b and the charge trap layer 14c can be controlled in a unit of one atomic layer.

Figure 11:
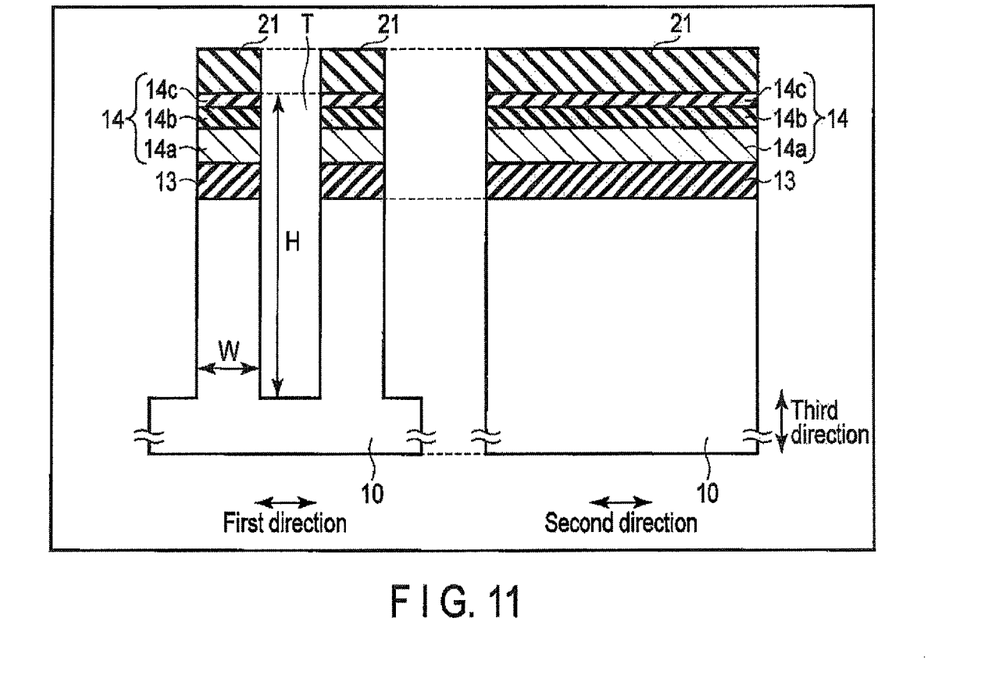
FIG. 11 is a sectional view illustrating the method for manufacturing the memory cell of the embodiment.

As illustrated in FIG. 11, a resist pattern 21 is formed on the charge storage layer 14 including the floating gate layer 14a, the interface insulating layer 14b, and the charge trap layer 14c by a PEP (Photo Engraving Process).

The charge storage layer 14, the gate insulating layer 13, and the semiconductor layer 10 are etched by RIE with the resist pattern 21 as a mask. As a result, an element isolation trench T is formed between the memory cell areas, and the memory cell areas are formed into the fin shapes by the element isolation trench T. The fin-shape memory cell area has a width W in the first direction, extends in the second direction, and has a height H in the third direction.

Then the resist pattern 21 is removed.

In the embodiment, the fin-shaped memory cell area is patterned with the resist pattern 21 as the mask. Alternatively, a hard mask layer may be used as the mask instead of the resist pattern 21.

Figure 12:
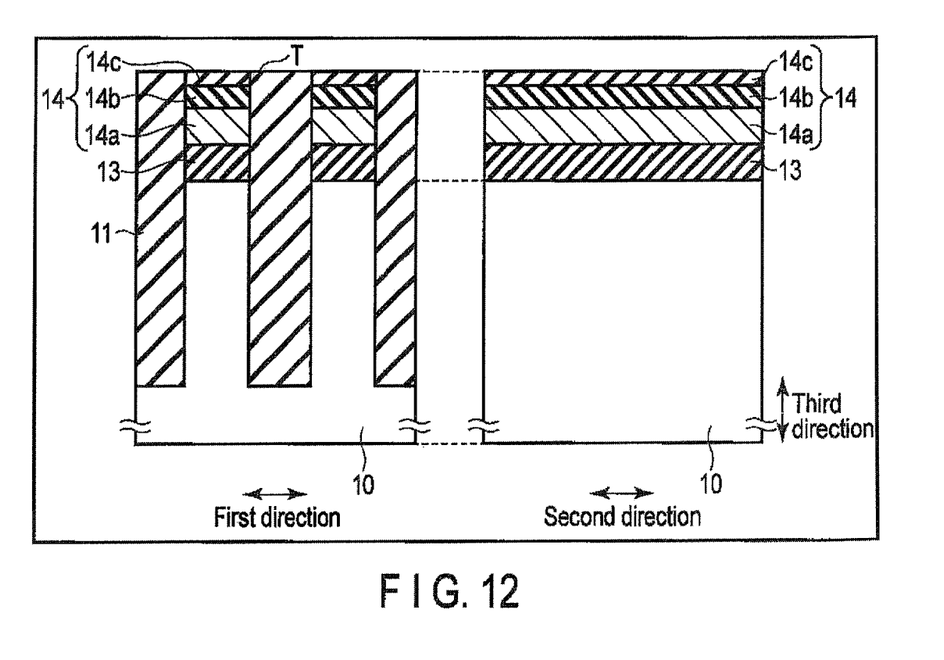
FIG. 12 is a sectional view illustrating the method for manufacturing the memory cell of the embodiment.

As illustrated in FIG. 12, the element isolation insulating layer (for example, the silicon oxide layer) 11 with which the element isolation trench T is completely filled is formed by the CVD method. The element isolation insulating layer 11 is polished by CMP (Chemical Mechanical Polishing) to leave the element isolation insulating layer 11 only in the element isolation trench T.

As a result, the element isolation insulating layer 11 having the STI (Shallow Trench Isolation) structure is formed.

Figure 13:
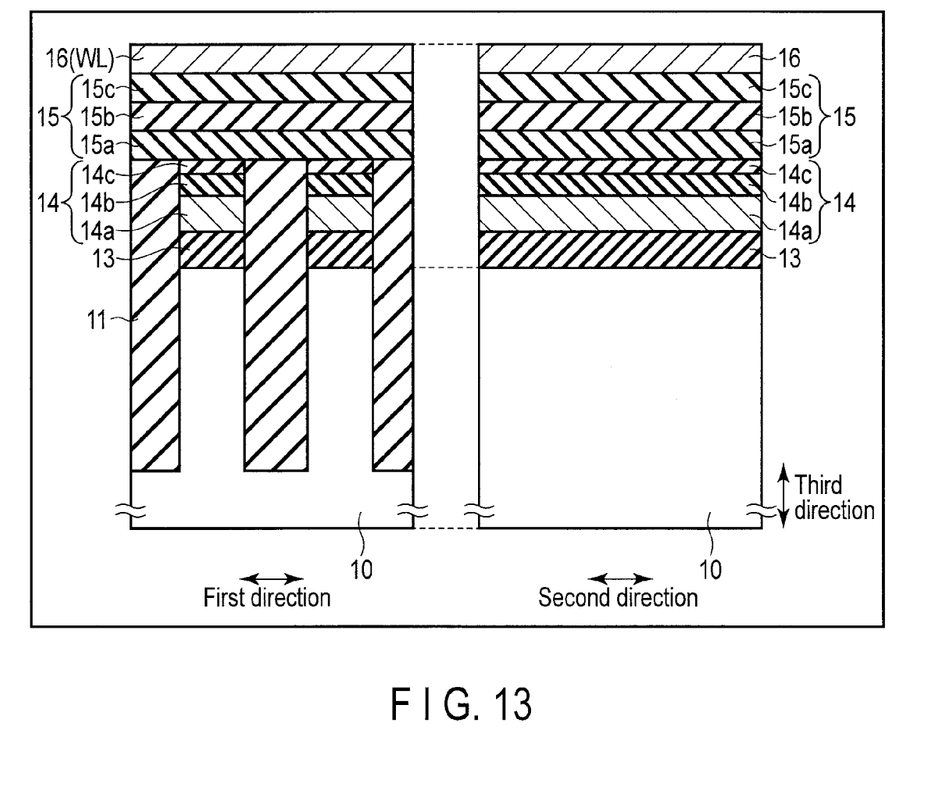
FIG. 13 is a sectional view illustrating the method for manufacturing the memory cell of the embodiment.

As illustrated in FIG. 13, for example, the block insulating layer (15a, 15b, and 15c) 15 is formed on the element isolation insulating layer 11 and the charge storage layer 14 by the CVD method and the ALD method. The block insulating layer 15 is formed on the flat underlayer. That is, the block insulating layer 15 covers only the upper surface of the charge storage layer 14, but does not cover a side surface of the charge storage layer 14. As described above, the structure is called the flat cell structure, and the flat cell structure is effective to narrow the width in the first direction of the memory cell to achieve the microfabrication of the memory cell.

For example, the control gate electrode 16 is formed on the block insulating layer 15 by the CVD method or the ALD method.

Figure 14:
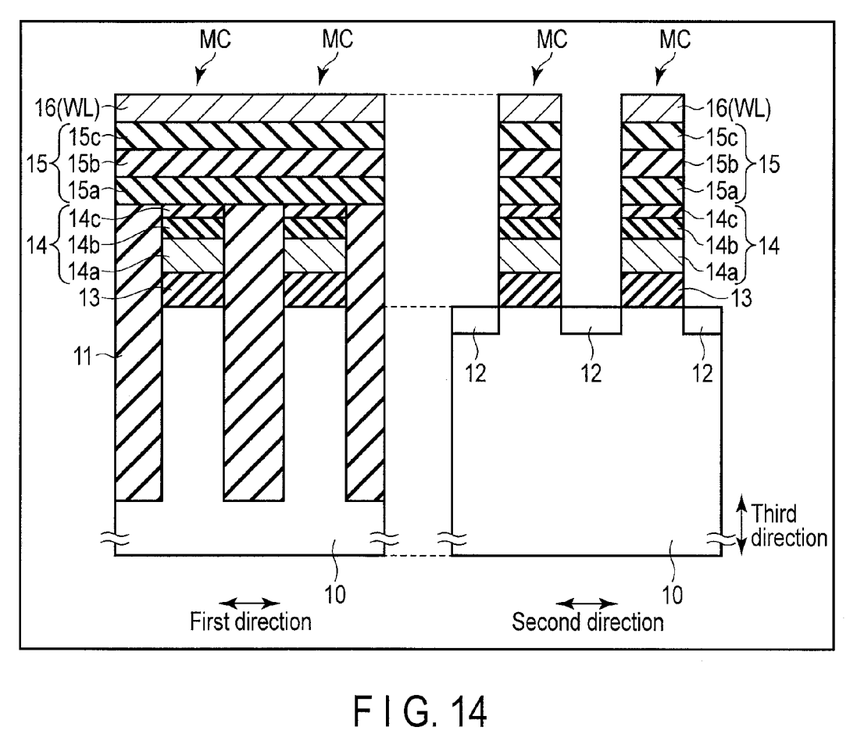
FIG. 14 is a sectional view illustrating the method for manufacturing the memory cell of the embodiment.

As illustrated in FIG. 14, for example, the memory cell is patterned by the PEP and the RIE.

For example, using a line-and-space resist pattern extending in the first direction as the mask, the control gate electrode 16, the block insulating layer 15, the charge storage layer 14, and the gate insulating layer 13 are sequentially etched to form the plurality of memory cells MC that is individually divided in the second direction.

At this point, the control gate electrode 16 constitutes the word line WL extending in the first direction.

Finally, an impurity is implanted in the semiconductor layer 10 by ion implantation with the control gate electrode 16 of the memory cell MC as the mask, the source/drain region 12 is formed in a self-aligned manner.

The nonvolatile semiconductor memory device in FIGS. 1 to 3 is completed through the above manufacturing processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor layer;
   a first insulating layer on the semiconductor layer;
   a charge storage layer on the first insulating layer;
   a second insulating layer on the charge storage layer; and
   a control gate electrode on the second insulating layer,
   wherein the charge storage layer includes a floating gate layer on the first insulating layer, an interface insulating layer on the floating gate layer, and a charge trap layer on the interface insulating layer,
   wherein the charge trap layer includes a first material, and the interface insulating layer includes a second material in which an alkali metal is added to the first material, and wherein a lower end of a conduction band of the interface insulating layer is higher than a trap level of the charge trap layer and is lower than a lower end of a conduction band of the charge trap layer.

2. The device of claim 1, wherein the first material is one selected from a group of $HfO_2$, HfSiO, $ZrO_2$, and ZrSiO.

3. The device of claim 1, wherein the alkali metal is Mg.

4. A nonvolatile semiconductor memory device comprising:
- a semiconductor layer;
- a first insulating layer on the semiconductor layer;
- a charge storage layer on the first insulating layer;
- a second insulating layer on the charge storage layer; and
- a control gate electrode on the second insulating layer,
- wherein the charge storage layer includes a floating gate layer on the first insulating layer, an interface insulating layer on the floating gate layer, and a charge trap layer on the interface insulating layer,
- wherein the charge trap layer includes a first material, and the interface insulating layer includes a second material in which a lanthanoid-based material is added to the first material, and
- wherein a lower end of a conduction band of the interface insulating layer is higher than a trap level of the charge trap layer and is lower than a lower end of a conduction band of the charge trap layer.

5. The device of claim 4, wherein the first material is one selected from a group of $HfO_2$, HfSiO, $ZrO_2$, and ZrSiO.

6. The device of claim 4, wherein the lanthanoid-based material is one of La and Y.

7. The device of claim 1, wherein side surfaces of the first insulating layer and the charge storage layer are covered with an element isolation insulating layer, and the second insulating layer and the control gate electrode are disposed on the charge storage layer and the element isolation insulating layer.

8. The device of claim 1, wherein the second insulating layer includes a plurality of layers having materials different from each other.

9. The device of claim 1, wherein the semiconductor layer is a semiconductor substrate.

10. The device of claim 4, wherein side surfaces of the first insulating layer and the charge storage layer are covered with an element isolation insulating layer, and the second insulating layer and the control gate electrode are disposed on the charge storage layer and the element isolation insulating layer.

11. The device of claim 4, wherein the second insulating layer includes a plurality of layers having materials different from each other.

12. The device of claim 4, wherein the semiconductor layer is a semiconductor substrate.

* * * * *